(12) United States Patent
Lei et al.

(10) Patent No.: US 9,082,702 B2
(45) Date of Patent: Jul. 14, 2015

(54) ATOMIC LAYER DEPOSITION METHODS FOR METAL GATE ELECTRODES

(71) Applicant: Applied Materials, Inc., Santa Clara, CA (US)

(72) Inventors: Yu Lei, Foster City, CA (US); Srinivas Gandikota, Santa Clara, CA (US); Xinyu Fu, Fremont, CA (US); Wei Tang, Santa Clara, CA (US); Atif Noori, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/771,236

(22) Filed: Feb. 20, 2013

(65) Prior Publication Data

US 2013/0221445 A1 Aug. 29, 2013

Related U.S. Application Data

(60) Provisional application No. 61/603,636, filed on Feb. 27, 2012.

(51) Int. Cl.
| | |
|---|---|
| *H01L 21/3205* | (2006.01) |
| *H01L 21/28* | (2006.01) |
| *H01L 29/49* | (2006.01) |
| *H01L 21/8238* | (2006.01) |
| *H01L 29/51* | (2006.01) |

(52) U.S. Cl.
CPC .... *H01L 21/28008* (2013.01); *H01L 21/28088* (2013.01); *H01L 21/823842* (2013.01); *H01L 21/823857* (2013.01); *H01L 29/4966* (2013.01); *H01L 29/517* (2013.01)

(58) Field of Classification Search
CPC ............. H01L 21/28008; H01L 21/28088; H01L 29/4966; H01L 21/823857; H01L 21/823842; H01L 29/517
USPC .......................................................... 438/592
See application file for complete search history.

(56) References Cited

U.S. PATENT DOCUMENTS

| | | | | |
|---|---|---|---|---|
| 6,271,136 | B1 * | 8/2001 | Shue et al. .................... | 438/687 |
| 6,596,643 | B2 * | 7/2003 | Chen et al. .................... | 438/706 |

(Continued)

FOREIGN PATENT DOCUMENTS

| | | |
|---|---|---|
| JP | 2011-249402 | 11/2011 |
| KR | 10-2009-0025589 | 3/2009 |

(Continued)

OTHER PUBLICATIONS

PCT International Search Report and Written Opinion for PCT/US2013/027748, mailed Jun. 27, 2013, 12 pages.

(Continued)

*Primary Examiner* — Charles Garber
*Assistant Examiner* — Syed Gheyas
(74) *Attorney, Agent, or Firm* — Servilla Whitney LLC

(57) ABSTRACT

Provided are devices and methods utilizing TiN and/or TaN films doped with Si, Al, Ga, Ge, In and/or Hf. Such films may be used as a high-k dielectric cap layer, PMOS work function layer, aluminum barrier layer, and/or fluorine barrier. These TiSiN, TaSiN, TiAlN, TaAlN, TiGaN, TaGaN, TiGeN, TaGeN, TiInN, TaInN, TiHfN or TaHfN films can be used where TiN and/or TaN films are traditionally used, or they may be used in conjunction with TiN and/or TaN.

8 Claims, 3 Drawing Sheets

(56) References Cited

U.S. PATENT DOCUMENTS

| | | | |
|---|---|---|---|
| 7,279,732 B2 | 10/2007 | Meng et al. | |
| 7,582,521 B2* | 9/2009 | Alshareef et al. | 438/199 |
| 7,611,972 B2* | 11/2009 | Govindarajan | 438/476 |
| 8,026,539 B2* | 9/2011 | Hargrove et al. | 257/288 |
| 8,115,264 B2* | 2/2012 | Park et al. | 257/412 |
| 2008/0318443 A1* | 12/2008 | Kim et al. | 438/785 |
| 2010/0065898 A1 | 3/2010 | Choi et al. | |
| 2011/0237063 A1 | 9/2011 | Kim et al. | |
| 2011/0284971 A1 | 11/2011 | Sakashita et al. | |
| 2011/0315980 A1 | 12/2011 | Kim et al. | |
| 2012/0037973 A1* | 2/2012 | Gomikawa et al. | 257/316 |

FOREIGN PATENT DOCUMENTS

| | | |
|---|---|---|
| KR | 10-2010-0031854 | 3/2010 |
| KR | 10-2011-0107206 | 9/2011 |

OTHER PUBLICATIONS

PCT International Preliminary Report on Patentability in PCT/US2013/027748, mailed Sep. 12, 2014, 9 pages.

\* cited by examiner

ATOMIC LAYER DEPOSITION METHODS FOR METAL GATE ELECTRODES

CROSS-REFERENCE TO RELATED APPLICATIONS

This application claims priority to U.S. Provisional Application No. 61/603,636, filed Feb. 27, 2012, the entire contents of which are hereby incorporated by reference.

BACKGROUND

Embodiments of the invention generally relate to high-k dielectric and/or metal gate technology. More specifically, embodiments of the invention are directed to methods of depositing metal gate electrodes.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide ($SiO_2$), silicon oxynitride (SiON), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN)). Replacement of polysilicon as a traditional material of the gate electrode with metals and metal-containing compounds reduces undesired voltage drops associated with the polysilicon depletion effect, as well as increases drive current performance and the operational speed of the CMOS transistor.

Currently, ALD TiN has been used for two different steps in the metal gate process: high-k cap layer and/or PMOS work function metal. Many logic/foundry manufacturers utilize a furnace-based process using $TiCl_4$ and $NH_3$ as the precursors. However, the film produced with this process can have high oxygen content and therefore may not be ideal for future scalability (oxygen can increase the electrical thickness). There is therefore a need for improved films which do not exhibit these types of problems.

SUMMARY

One aspect of the invention relates to an integrated circuit transistor device comprising a high-k dielectric layer disposed over a channel and a metal nitride layer over the high-k dielectric layer, the metal nitride layer selected from TiSiN, TaSiN, TiAlN, TaAlN, TiGaN, TaGaN, TiGeN, TaGeN, TiInN, TaInN, TiHfN and TaHfN. In one or more embodiments, the metal nitride layer is in contact with the high-k dielectric layer. In some embodiments, the method further comprises one or more intermediate layers between the high-k dielectric layer and the metal nitride layer. In one or more embodiments, a layer comprising aluminum overlies the metal nitride film.

In some embodiments, the metal nitride layer is formed by atomic layer deposition and has a thickness having a range of about 2 Angstroms to about 200 Angstroms. In one or more embodiments, the metal nitride layer has a thickness having a range of about 5 Angstroms to about 100 Angstroms. In some embodiments, the metal nitride layer comprises TiSiN.

Another aspect of the invention relate to a method of forming an integrated circuit transistor device with a metal gate, the method comprising providing a substrate comprising a high-k dielectric layer, and exposing the substrate to a first precursor comprising Ti or Ta, a second precursor comprising an ammonia source, and a third precursor comprising a Si, Al, Ga, Ge, In or Hf source, to provide a film selected from TiSiN, TaSiN, TiAlN, TaAlN, TiGaN, TaGaN, TiGeN, TaGeN, TiInN, TaInN, TiHfN or TaHfN. In one or more embodiments, the first precursor is selected from $TaCl_5$, $TaF_5$, $TaBr_5$, pentakis(dimethylamino)tantalum, tertiarybutylimidotris(ethylmethylamido)tantalum, tertiarybutylimidotris(diethylamido) tantalum, $TiCl_4$, $TiBr_4$, $TiI_4$, $TiF_4$, and tetrakisdimethylamino titanium. In some embodiments, the ammonia source is ammonia gas or $N_2H_2$ or $N_2H_4$. In one or more embodiments, the third precursor comprises one or more selected from $AlCl_3$, $AlBr_3$, trimethylaluminium, dimethylaluminium hydride, tris(diethylamino)aluminium, trimethylamine alane, triethyl-amine alane, dimethylethylamine alane, triisobutylaluminum, triethylaluminum, dimethylaluminum hydride, diethylaluminum chloride, trimethyl gallium, gallium tribromide, gallium trichloride, triethylgallium, triisopropylgallium, tris(dimethylamido)gallium, tri-tert-butylgallium, digermane, germane, tetramethylgermanium, hafnium (IV) chloride, hafnium(IV) tert-butoxide, tetrakis (diethylamido)hafnium(IV), tetrakis(dimethylamido) hafnium(IV), tetrakis(ethylmethylamido)hafnium(IV), indium trichloride, triethylindium, indium acetylacetonate, indium(I) iodide, silane, disilane, trimethylsilane, and neopentasilane.

In some embodiments, the substrate surface is exposed to the first and third or second and third precursors simultaneously. In one or more embodiments, the metal nitride layer comprises TiSiN. In some embodiments, the substrate surface is alternately exposed to the first, second and third precursors.

In one or more embodiments, the substrate surface is exposed to the precursors repeatedly to obtain a film thickness of about 2 Angstroms to about 200 Angstroms. In some embodiments, the substrate surface has a temperature of about 200 to about 700° C. during deposition. In one or more embodiments, the method further comprises depositing a layer comprising aluminum over the metal nitride layer. In some embodiments, the method further comprises depositing a layer over the metal nitride layer, wherein depositing the layer comprising exposure to a fluorine-containing precursor.

Another aspect of the invention relates to a method of forming an integrated circuit transistor device with a metal gate, the method comprising providing a substrate comprising a high-k dielectric layer, exposing a substrate surface to two precursors, wherein the first precursor comprises Ti or Ta, and the second precursor comprises ammonia gas or $N_2H_2$ or $N_2H_4$, to provide a film comprising TaN or TiN, and exposing the substrate surface to a third precursor, wherein the third precursor comprises a Si, Al, Ga, Ge, In or Hf source, to provide a film comprising TiSiN, TaSiN, TiAlN, TaAlN, TiGaN, TaGaN, TiGeN, TaGeN, TiInN, TaInN, TiHfN or TaHfN. In one or more embodiments, the substrate surface is exposed to the first and second precursors repeatedly before exposure to the third precursor.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
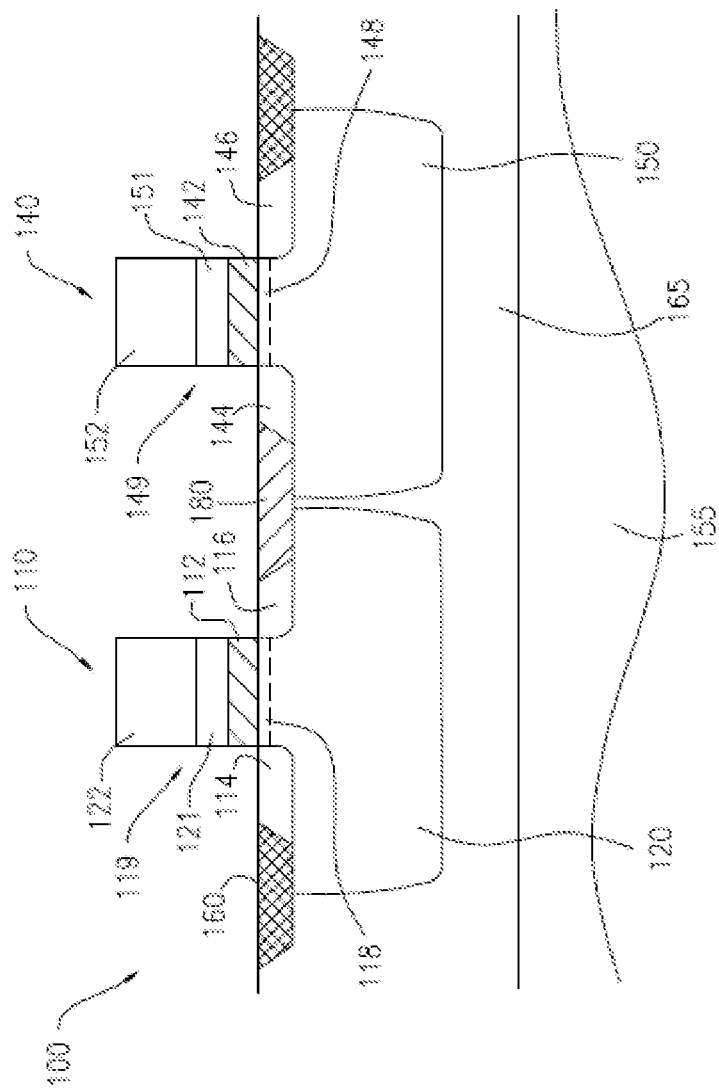
FIG. 1 is a cross-sectional view of a field effect transistor pair.

Before describing several exemplary embodiments of the invention, it is to be understood that the invention is not limited to the details of construction or process steps set forth in the following description. The invention is capable of other embodiments and of being practiced or being carried out in various ways. It is also to be understood that the complexes and ligands of the present invention may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

Embodiments of the invention are useful in the manufacture of semiconductor devices, including but not limited to semiconductor devices that require a capacitive element. Examples of such devices include metal oxide semiconductor field effect transistors (MOSFET). MOS device design is a complicated process. For example, in the design of MOSFETs, improvements made by maximizing drive current result in increased leakage current. Conversely, an improvement such as decreased leakage current negatively impacts the drive current.

It has been discovered that doping TiN or TaN layers with certain elements provides very beneficial results during circuit integration. Such elements include Si, Al, Ga, Ge, In and Hf to provide TiSiN, TaSiN, TiAlN, TaAlN, TiGaN, TaGaN, TiGeN, TaGeN, TiInN, TaInN, TiHfN or TaHfN. These films can be advantageously used in any metal gate or metal electrode application in logic, DRAM or flash and/or any barrier application in logic, DRAM or flash. The films described herein may also have application in other parallel technologies. For example, the films can be used in the metal gate stack where TiN and/or TaN are usually used. Such gates include, but are not limited to, tri gate structures and FINFET, as well as replacement gate structure. Specifically, in one or more embodiments, the films described can be used as a high-k dielectric cap layer, as a PMOS work function metal and/or as an aluminum barrier layer. In one or more embodiments, the metal nitride films are effective as fluorine barriers, particularly when fluorine-containing precursors are used to deposit films over the metal nitride films. In some embodiments, the TiSiN, TaSiN, TiAlN, TaAlN, TiGaN, TaGaN, TiGeN, TaGeN, TiInN, TaInN, TiHfN or TaHfN films can be used in addition to conventional TiN and/or TaN films. The films, methods and devices described herein exhibit reduced electrical thickness (i.e., EOT), reduced gate leakage (i.e., $J_g$), improved device/carrier mobility, and increased work function. The films can also exhibits improved Al barrier properties, which allow for direct Al fill over the doped TiN/TaN film.

Accordingly, one aspect of the invention relates to an integrated circuit transistor device comprising: a high-k dielectric layer disposed over a channel; and a metal nitride layer over the high-k dielectric layer, the metal nitride layer selected from TiSiN, TaSiN, TiAlN, TaAlN, TiGaN, TaGaN, TiGeN, TaGeN, TiInN, TaInN, TiHfN and TaHfN. In one or more embodiments, the metal nitride layer is in contact with the high-k dielectric layer. This embodiment relates to scenarios where the metal nitride layer is a high-k dielectric cap layer. As the metal nitride layer can also act as aluminum barrier, there is no need for an additional Al barrier layer. Thus, the metal nitride can have dual functionality.

In one or more other embodiments, the integrated circuit transistor device further comprises one or more intermediate layers between the high-k dielectric layer and the metal nitride layer. In certain of these embodiments, the metal nitride layer can act as an Al barrier layer, where another high-k dielectric cap layer is utilized. In certain other of these embodiments, the metal nitride layer functions as a PMOS work function metal layer in the metal gate stack.

The metal nitrides layers described herein may be formed during an atomic layer deposition process, which will be described further below. In certain embodiments, the metal nitride layer can be as thin as about 2 A or about 5 A, ranging up to about 70 A, about 80, about 100 or about 200 A. In further embodiments, the metal nitride layer has a thickness ranging from about 2 Angstroms to about 200 Angstroms, from about 5 to about 100 Angstroms, or about 5 to about 80 Angstroms.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon substrate 155 doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a high-k dielectric cap layer 121 and a metal gate work function layer 122. The source and drain regions are n-type regions on opposite sides of the gate region 119. Channel region 118 is interposed between source region 114 and drain region 116. A gate dielectric layer 112 separates channel region 118 and metal gate work function layer 121. Gate dielectric layer 112 electrically insulates first metal region 121 from channel region 118. The gate dielectric layer 112, the high-k dielectric cap layer 121 metal gate work function layer 122 together may be referred to herein as a gate stack. The gate dielectric region 112 can be any suitable high-k dielectric material. In one or more embodiments, the high-k dielectric cap layer 121 may comprise TiSiN, TaSiN, TiAlN, TaAlN, TiGaN, TaGaN, TiGeN, TaGeN, TiInN, TaInN, TiHfN and/or TaHfN films. In such embodiments, high-k dielectric cap layer 121 has dual functionality and also serves as an effective Al barrier. Alternatively, high-k dielectric cap layer 121 may comprise two layers: a TaN or TiN layer, as well as a doped metal nitride layer. In one or more embodiments, such TaN and/or TiN layers may be used as a buffer layer to prevent reaction between the high-k dielectric layer and the doped metal nitride layer. When an appropriate voltage is applied between p-type silicon substrate 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a high-k dielectric cap layer 151 and a metal gate work function layer 152. The source and drain regions are p-type regions on opposite sides of gate region 149. Channel region 148 is interposed between source region 144 and drain region 146. A gate dielectric 142 separates channel region 148 and high-k dielectric cap layer 151. Dielectric 142 electrically insulates high-k dielectric cap layer 151 from channel region 148. The gate dielectric layer 142, high-k dielectric cap layer 151 and metal gate work function layer 152 together may be referred to herein as a gate stack. In one or more embodiments of the invention, the high-k dielectric cap layer 151 can comprise a TiSiN, TaSiN, TiAlN, TaAlN, TiGaN, TaGaN, TiGeN, TaGeN, TiInN, TaInN, TiHfN and TaHfN film. In such embodiments, high-k dielectric cap layer 151 may have dual functionality and also serves as an effective Al barrier. In such embodiments, an aluminum-containing film overlies the doped metal nitride layer. In one or more embodiments, high-k dielectric cap layer 151 may comprise two layers: a TaN or TiN layer and a doped metal nitride layer. In some embodiments, metal gate work function layer 152, which is a PMOS work function layer, can comprise TiSiN, TaSiN, TiAlN, TaAlN, TiGaN, TaGaN, TiGeN, TaGeN, TiInN, TaInN, TiHfN and/or TaHfN films deposited according to one or more of the methods described herein. When an appropriate voltage is applied between p-type silicon substrate 155 and gate region 149, holes from n-well 150 move into region 148 directly below dielectric layer 142 thereby creating a p-type channel 148. A voltage applied between source 144 and drain 146 causes current to flow between source 144 and drain 146.

Thus, there are many combinations of using the metal nitride layers described herein in a gate stack. For example, in one embodiment, the gate stack may comprise a high-k dielectric layer, followed by a cap layer (e.g., doped TiN), followed by an etch stop layer (e.g., doped TaN), followed by a PMOS WF metal layer (doped TiN). Other embodiments relate to scaled devices comprising a high-k dielectric layer, followed by a high-k cap layer (e.g., doped TiN), followed by a PMOS work function metal (doped TiN), or just high-k/PMOS WF metal (e.g., doped TiN).

In one or more embodiments, the doped metal nitride layer is effective as a fluorine barrier. For example, $WF_6$ may be used to deposit CVD W fill. The fluorine in the $WF_4$ precursor may also deposit into the underlying substrate and modify it, for example increasing the work function of NMOS. Accordingly, by placing a doped metal nitride film over an NMOS film, fluorine contamination can be minimized during subsequent deposition using fluorine-containing precursors.

Another aspect of the invention relates to a method of forming an integrated circuit transistor device with a metal gate. The method comprises providing a substrate comprising a high-k dielectric layer; and exposing the substrate to a first precursor comprising Ti or Ta, a second precursor comprising an ammonia source, and a third precursor comprising a Si, Al, Ga, Ge, In or Hf source, to provide a film selected from TiSiN, TaSiN, TiAlN, TaAlN, TiGaN, TaGaN, TiGeN, TaGeN, TiInN, TaInN, TiHfN or TaHfN. In one or more embodiments, exposing the substrate surface comprises an atomic layer deposition process. In one or more other embodiments, the substrate surface is exposed to the precursors repeatedly to obtain a film thickness of about 2 Angstroms to about 200 Angstroms. In certain variants of the method, the substrate surface has a temperature of about 200 to about 700° C. during deposition.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and inorganic/halide compounds In generally, any suitable tantalum or titanium precursor used during the conventional TiN/TaN process can be used. Thus, tantalum precursors can include, but are not limited to $TaCl_5$, $TaF_5$, $TaBr_5$, pentakis(dimethylamino)tantalum (PDMAT), tertiarybutylimidotris(ethylmethylamido)tantalum (TBTEMT) and tertiarybutylimidotris(diethylamido)tantalum (TBTDET). Titanium precursors can include, but are not limited to $TiCl_4$, $TiBr_4$, $TiI_4$, $TiF_4$, tetrakisdimethyl-amino titanium. Additionally, any suitable ammonia source precursor can be used. Examples include, but are not limited to, ammonia gas or $N_2H_2$ or $N_2H_4$.

Various precursors for the doping elements can be used. Examples of precursors for aluminum include, but are not limited to, $AlCl_3$, $AlBr_3$, trimethylaluminium, dimethylaluminium hydride, tris(diethylamino)aluminium, trimethylamine alane, triethyl-amine alane, dimethylethylamine alane, triisobutylaluminum, triethylaluminum, dimethylaluminum hydride, and diethylaluminum chloride. Examples of gallium precursors include, but are not limited to, trimethyl gallium, gallium tribromide, gallium trichloride, triethylgallium, triisopropylgallium, tris(dimethylamido)gallium and tri-tert-butylgallium. Germanium precursors may be selected from digermane, germane, and tetramethylgermanium. Precursors for hafnium can include hafnium(IV) chloride, hafnium(IV) tert-butoxide, tetrakis(diethylamido)hafnium (IV), tetrakis(dimethylamido)hafnium(IV), and tetrakis(ethylmethylamido)hafnium(IV). Exemplary indium precursors include, indium trichloride, triethylindium, indium acetylacetonate, and indium(I) iodide. Finally, silane precursors can include, but are not limited to, silane, disilane, trimethylsilane, and neopentasilane.

The way that the substrate surface is exposed to the precursors can be varied. In some embodiments, the substrate surface is exposed to the first and third precursors simultaneously. In other embodiments, the substrate surface is exposed to the second and third precursors simultaneously. In yet other embodiments, the substrate surface is alternately exposed to the first, second and third precursors. Table 1 below shows several non-limiting sequence variants.

TABLE 1

Exemplary Deposition Sequences

| Options | Sequence |
|---|---|
| 1 | TiCl4/TaCl5 → purge→NH3 →purge→ Si/Al/Ga/Ge/In/Hf source →purge→ NH3 →purge→ repeat |
| 2 | Si/Al/Ga/Ge/In/Hf source → purge→NH3 →purge→ TiCl4/TaCl5 →purge→ NH3 →purge→ repeat |
| 3 | TiCl4/TaCl5 →purge→ (NH3 + Si/Al/Ga/Ge/In/Hf source) → purge→ repeat |
| 4 | (TiCl4/TaCl5 + Si/Al/Ga/Ge/In/Hf source) → purge→ NH3 → purge →repeat |
| 5 | TiCl4/TaCl5 → Si/Al/Ga/Ge/In/Hf source →purge→ NH3 → purge →repeat |
| 6 | Si/Al/Ga/Ge/In/Hf source → TiCl4/TaCl5 → purge→NH3 →purge→ repeat |

As briefly mentioned above, the TiSiN, TaSiN, TiAlN, TaAlN, TiGaN, TaGaN, TiGeN, TaGeN, TiInN, TaInN, TiHfN or TaHfN films can be used instead of conventional TiN or TaN films. However, they may also be used in addition to TiN and/or TaN film layers. Thus, in certain embodiments of the invention, the substrate surface is exposed to the first and second precursors repeatedly before being exposed to the third precursor.

Accordingly, another aspect of the invention relate to a method of forming an integrated circuit transistor device with a metal gate, the method comprising: providing a substrate comprising a high-k dielectric layer; exposing a substrate surface to two precursors, wherein the first precursor comprises Ti or Ta, and the second precursor comprises an ammonia source, to provide a film comprising TaN or TiN; and exposing the substrate surface to a third precursor, wherein the third precursor comprises a Si, Al, Ga, Ge, In or Hf source, to provide a film comprising TiSiN, TaSiN, TiAlN, TaAlN, TiGaN, TaGaN, TiGeN, TaGeN, TiInN, TaInN, TiHfN or TaHfN. In some embodiments, the substrate surface is exposed to the first and second precursors repeatedly before exposure to the third precursor. The precursors described above can be used in accordance with this method.

In such embodiments with TiN and TaN layers, the TiN/TaN film can have a thickness ranging from about 5, 10 or 20 Å to about 40 or 50 Å. Thus, in certain embodiments of this aspect, the substrate surface is exposed to the first and second precursor to obtain the desired TiN/TaN film thickness. In certain other embodiments, the substrate surface has a temperature of about 200 to about 700° C. In further embodiments, the substrate surface has a temperature of about 300 to about 600° C. In yet other embodiments, the method further comprises depositing a conductive metal layer over the TiN or TaN layer.

Additionally, the films, methods and devices described herein can be deposited in a single wafer metal ALD chamber. Dual seal hardware can be used to minimize the oxygen content in the film to about 1%. In embodiments where TiN/TaN films are first deposited, followed by doped TiN/TaN layers, all of the deposition process can occur in the same chamber without breaking seal.

Other features of the process can be any suitable technique known to one of ordinary skill in the art. For example, in some embodiments, a purge gas (also referred to as a carrier gas or diluent gas) may be used during the deposition process. Any suitable purge gas may be used, such as, but not limited to, argon, helium, hydrogen, nitrogen and mixtures thereof.

Additionally, the high-k dielectric film can be any suitable film. In detailed embodiments, the high-k dielectric film comprises an element selected from the group consisting of Hf, Zr, Ta, La, Gd, Y, Al, Pr, Sc, Ti, In, Lu, rare-earth metals and combinations thereof. In specific embodiments, the high-k film metal oxides and/or metal silicates of one or more of Hf, Zr, Ta, La, Gd, Y, Al, Pr, Sc, Ti, In, Lu, rare-earth metals and combinations thereof. In detailed embodiments, the high-k dielectric film comprises hafnium oxide. Furthermore, the high-k dielectric film can be deposited by any suitable technique, including, but not limited to, chemical vapor deposition (CVD) and atomic layer deposition (ALD). In detailed embodiments, the high-k film is deposited by atomic layer deposition.

Finally, the processes of the invention can be carried out in equipment known in the art of ALD, CVD, etc. The apparatus brings the sources into contact with a substrate on which the films are grown.

EXAMPLE

Figure 2:
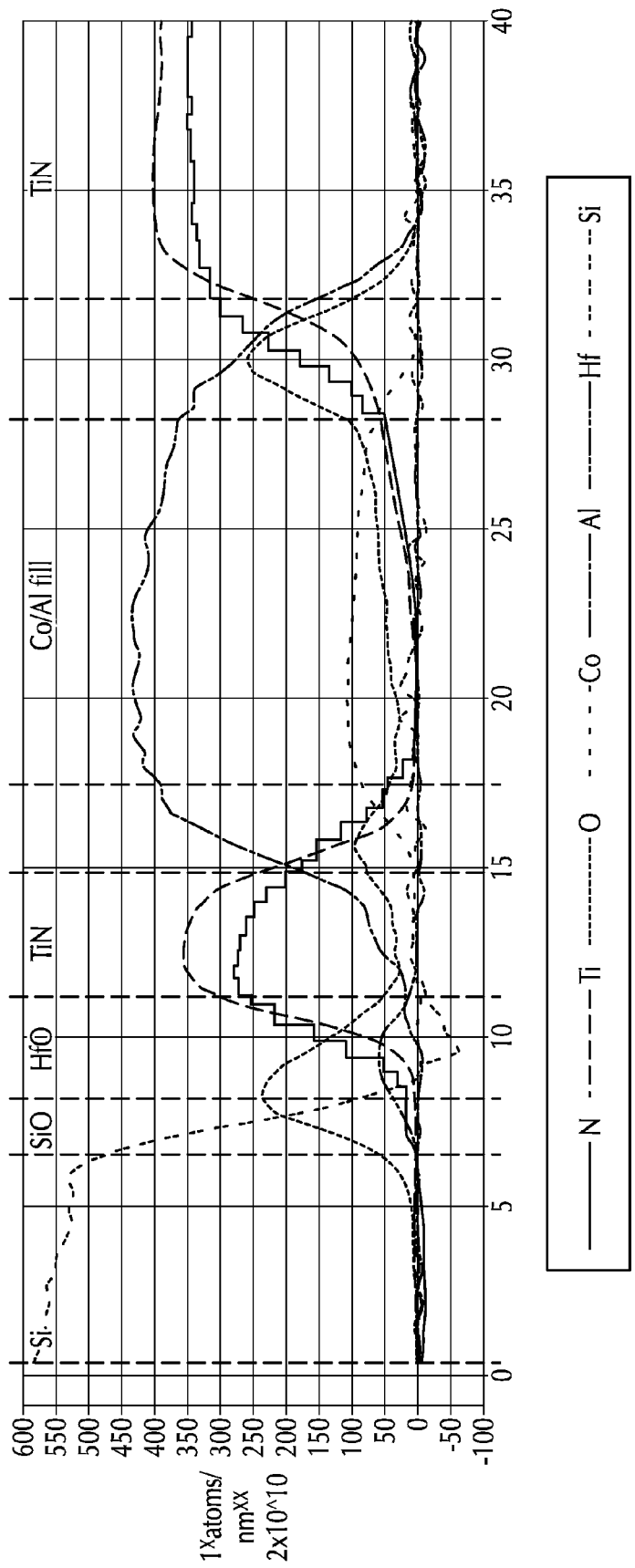
FIG. 2 shows the elemental content of a comparative MOSCAP structure.
Figure 3:
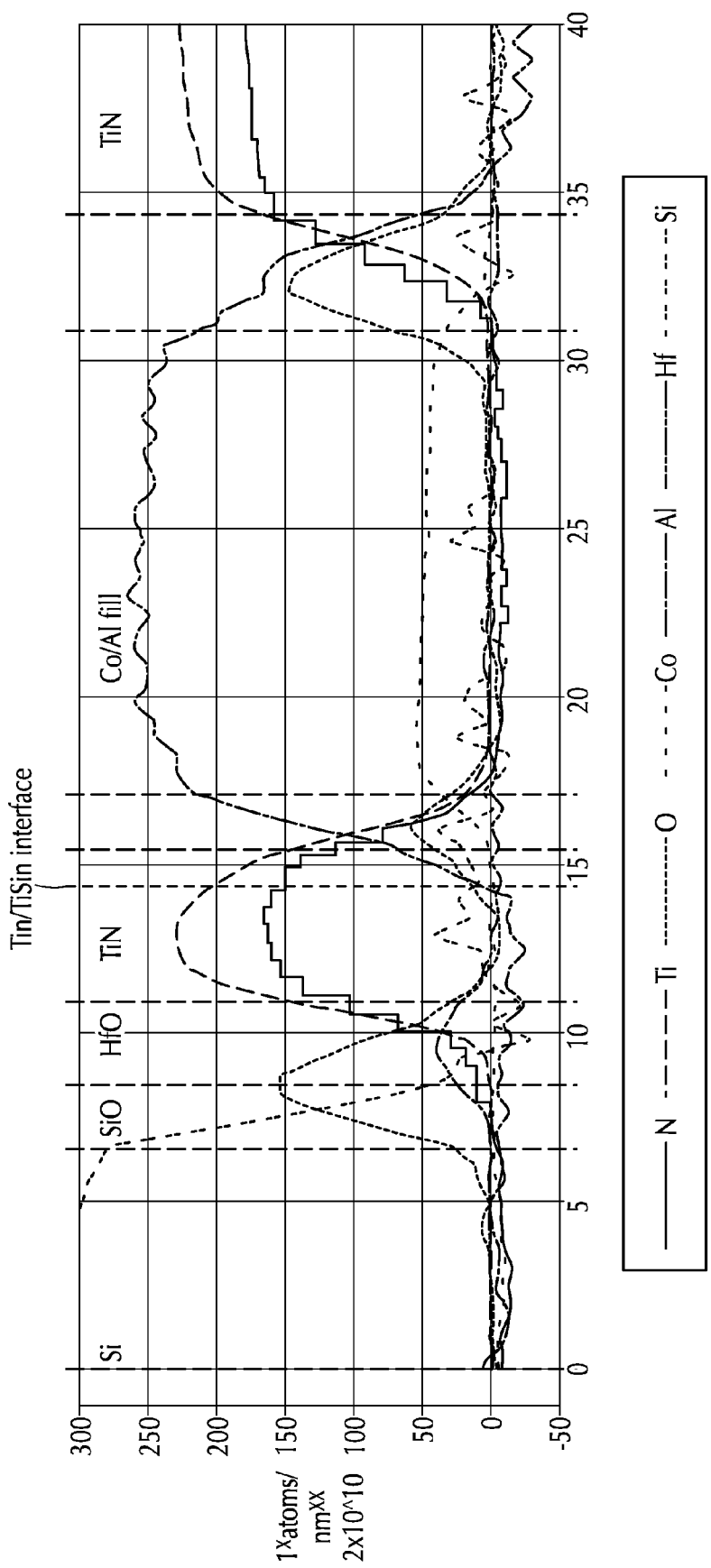
FIG. 3 shows the elemental content of a MOSCAP structure according to one or more embodiments of the invention.

Two metal oxide semiconductor (MOSCAP) structures were produced. The first had thermal oxidation of an interface layer, ALD HfO$_2$, ALD TiN, CVD Co, CVD Al, and a TiN cap layer. This first MOSCAP structure is considered comparative because it does not contain a doped metal nitride layer. The second was similar, except that it had ALD TiSiN, instead of TiN. This second MOSCAP structure is considered inventive, because it contains a doped metal nitride layer (i.e., TiSiN). FIGS. 2 and 3 show the elemental content of the various layers in the structures of the comparative and inventive structures, respectively. As shown in FIG. 2, the aluminum trace goes through the TiN and into the underlying HfO$_2$ layer. In contrast, as shown in FIG. 3, the aluminum trace terminates within the TiSiN layer and does not penetrate into the underlying HfO$_2$ layer. These results show how the TiSiN layer is effective as an aluminum barrier layer, where previously used films (i.e., TiN), would allow aluminum migration.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming an integrated circuit transistor device with a metal gate, the method comprising:
   providing a substrate having a surface comprising a high-k dielectric layer, wherein the high-k dielectric layer comprises a metal oxide and/or metal silicate of one or more of Hf, Zr, Ta, La, Gd, Y, Al, Pr, Sc, Ti, In, Lu, rare-earth metals and combinations thereof, and the substrate surface has a temperature in the range of about 200° C. to about 700° C.; and
   exposing the substrate to a first precursor comprising Ti or Ta, a second precursor comprising an ammonia source, and a third precursor comprising a Si, Al, Ga, Ge, In or Hf source, wherein the substrate surface is exposed to the first and third precursor simultaneously followed by a purge before exposure to the second precursor to provide a metal nitride layer selected from TiSiN, TaSiN, TiAlN, TaAlN, TiGaN, TaGaN, TiGeN, TaGeN, TiInN, TaInN, TiHfN or TaHfN.

2. The method of claim 1, wherein the first precursor is selected from $TaCl_5$, $TaF_5$, $TaBr_5$, pentakis(dimethylamino)tantalum, tertiarybutylimidotris(ethylmethylamido)tantalum, tertiarybutylimidotris(diethylamido)tantalum, $TiCl_4$, $TiBr_4$, $TiI_4$, $TiF_4$, and tetrakisdimethyl-amino titanium.

3. The method of claim 1, wherein the ammonia source is ammonia gas or $N_2H_2$ or $N_2H_4$.

4. The method of claim 1, wherein the third precursor comprises one or more selected from $AlCl_3$, $AlBr_3$, trimethylaluminium, dimethylaluminium hydride, tris(diethylamino)aluminium, trimethylamine alane, triethyl-amine alane, dimethylethylamine alane, triisobutylaluminum, triethylaluminum, dimethylaluminum hydride, diethylaluminum chloride, trimethyl gallium, gallium tribromide, gallium trichloride, triethylgallium, triisopropylgallium, tris(dimethylamido)gallium, tri-tert-butylgallium, digermane, germane, tetramethylgermanium, hafnium(IV) chloride, hafnium(IV) tert-butoxide, tetrakis(diethylamido)hafnium (IV), tetrakis(dimethylamido)hafnium(IV), tetrakis(ethylmethylamido)hafnium(IV), indium trichloride, triethylindium, indium acetylacetonate, indium(I) iodide, silane, disilane, trimethylsilane, and neopentasilane.

5. The method of claim 1, the metal nitride layer comprises TiSiN.

6. The method of claim 3, wherein the substrate surface is exposed to the precursors repeatedly to obtain a film thickness of about 2 Angstroms to about 200 Angstroms.

7. The method of claim 1, further comprising depositing a layer comprising aluminum over the metal nitride layer.

8. The method of claim 1, further comprising depositing a layer over the metal nitride layer, wherein depositing the layer comprising exposure to a fluorine-containing precursor.

* * * * *